United States Patent [19]

Morton

[11] Patent Number: 5,693,947

[45] Date of Patent: Dec. 2, 1997

[54] RADIATION DETECTORS

[75] Inventor: Edward J. Morton, Guildford, United Kingdom

[73] Assignee: The University of Surrey, Guildford, United Kingdom

[21] Appl. No.: 537,873

[22] PCT Filed: Apr. 26, 1994

[86] PCT No.: PCT/GB94/00882

§ 371 Date: Oct. 30, 1995

§ 102(e) Date: Oct. 30, 1995

[87] PCT Pub. No.: WO94/25878

PCT Pub. Date: Nov. 10, 1994

[30] Foreign Application Priority Data

Apr. 28, 1993 [GB] United Kingdom ............... 9308817
May 19, 1993 [GB] United Kingdom ............... 9310360

[51] Int. Cl.$^6$ .................. G01T 1/00; G01T 1/24; G01T 1/29
[52] U.S. Cl. .......................................... 250/370.09
[58] Field of Search ............................. 250/370.09

[56] References Cited

U.S. PATENT DOCUMENTS

| | | | |
|---|---|---|---|
| 4,810,881 | 3/1989 | Berger et al. | 250/370.01 |
| 4,885,620 | 12/1989 | Kemmer et al. | |
| 4,926,052 | 5/1990 | Hatayama et al. | 250/370.14 |
| 4,945,242 | 7/1990 | Berger et al. | 250/367 |
| 5,017,989 | 5/1991 | Street et al. | 357/30 |
| 5,023,661 | 6/1991 | Fender et al. | 355/210 |
| 5,043,582 | 8/1991 | Cox et al. | 250/370.09 |
| 5,079,426 | 1/1992 | Antonuk et al. | 250/370.09 |
| 5,132,541 | 7/1992 | Conrads et al. | 250/370.01 |
| 5,153,423 | 10/1992 | Conrads et al. | 250/208.1 |
| 5,164,809 | 11/1992 | Street et al. | 257/55 |
| 5,166,524 | 11/1992 | Lee et al. | |
| 5,168,160 | 12/1992 | Jeromin et al. | |
| 5,182,624 | 1/1993 | Tran et al. | 257/40 |
| 5,198,673 | 3/1993 | Rougeot et al. | 250/370.11 |
| 5,220,170 | 6/1993 | Cox et al. | 250/370.09 |
| 5,254,480 | 10/1993 | Tran | 437/2 |
| 5,300,784 | 4/1994 | Fender et al. | 250/484.2 |
| 5,313,066 | 5/1994 | Lee et al. | 250/370.09 |
| 5,319,206 | 6/1994 | Lee et al. | 250/370.09 |
| 5,331,145 | 7/1994 | Weckler et al. | 250/208.1 |
| 5,331,179 | 7/1994 | Lee et al. | 250/591 |
| 5,381,014 | 1/1995 | Jeromin et al. | 250/370.09 |

FOREIGN PATENT DOCUMENTS

WO 85/04987  11/1995  WIPO .

OTHER PUBLICATIONS

Antonuk et al., "Development of Thin–Film, Flat–Panel Arrays for Diagnostic and Radiotherapy Imaging," Conference Proceedings of SPIE Medical Imaging VI, Newport Beach, CA (Feb., 1992).

Antonuk et al., "Large Area, Flat–Panel a–Si:H Arrays for X–Ray Imaging," *Physics of Medical Imaging, 1896*, 18–29 (Feb., 1993).

Primary Examiner—Constantine Hannaher
Attorney, Agent, or Firm—Leydig, Voit & Mayer, Ltd.

[57] ABSTRACT

A radiation detector has a dual-capacitive structure comprising an array A of first capacitors (10) including discrete electrodes (13) arranged in rows and columns and a second capacitor (20). The second capacitor (20) incorporates a radiation converter (21) which co-operates with the first capacitors (10) to cause an accumulation of charge on the discrete electrodes (13) according to the spatial distribution of radiation to which the radiation converter is exposed. Read-out means (30) is provided to output a signal representative of the accumulated charge.

28 Claims, 6 Drawing Sheets

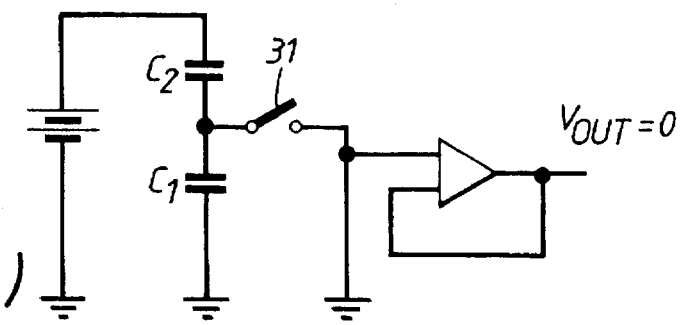
Fig.4(a) STAGE 1: INTEGRATION
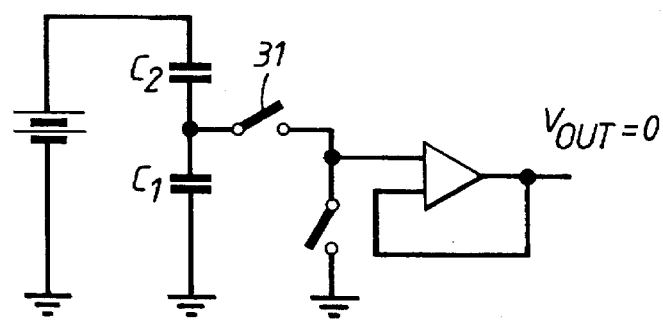
Fig.4(b) STAGE 2: PREPARE FOR READOUT
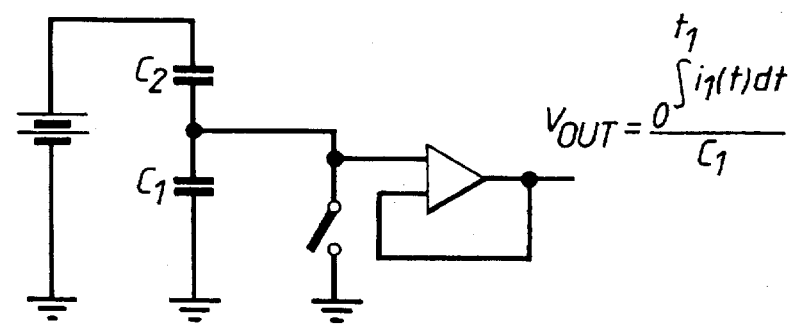
Fig.4(c) STAGE 3: READOUT
$$V_{OUT} = \frac{\int_0^{t_1} i_1(t)dt}{C_1}$$
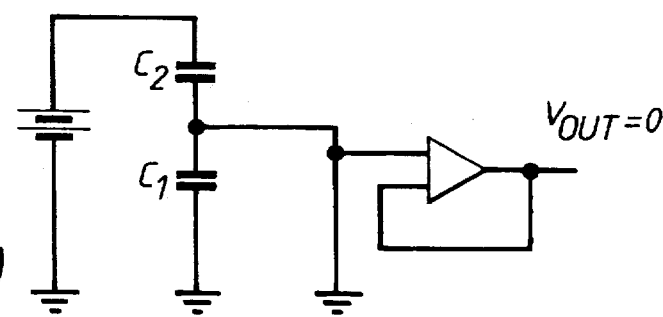
Fig.4(d) STAGE 4: PIXEL RESET

IMAGING (E.G. MEDICAL X-RADIATION) SYSTEM

RADIATION DETECTOR

RADIATION DETECTORS

BACKGROUND OF THE INVENTION

This invention relates to radiation detectors and in particular to large-area, two-dimensional, pixellated radiation detectors.

The invention has particular, though not exclusive application to such detectors used for medical imaging; for example, medical X-radiation imaging.

Pixellated radiation detectors usually comprise an array of radiation-sensitive elements layed out in two-dimensional fashion. Typically, the elements are arranged in rows and columns to form a regular array.

In one known example of such radiation detectors each element in the array comprises a reverse-biased photodiode coupled to a transistor. During signal integration, the transistor is held in a non-conducting state and an optical radiation signal derived from the incident radiation is allowed to discharge the bias applied across the photodiode. The signal is then readout by switching the transistor to its conducting state and recording the amount of charge required to restore the reverse bias across the photodiode. Such arrays are typically constructed from crystalline silicon or hydrogenated amorphous silicon (a - Si:H).

A radiation detector of this kind tends to be unsatisfactory in that the detector exhibits non-linear performance and saturation for large input signals, and leakage current in an a-Si:H sensor results in appreciable detected shot noise. Also, such radiation detectors suffer from image lag due to trapping sites in the semiconductor material.

SUMMARY OF THE INVENTION

According to one aspect of the invention there is provided a radiation detector comprising, first capacitive means including a two-dimensional array of discrete, charge-collection electrodes, second capacitive means including radiation conversion means, the second capacitive means being co-operable with the first capacitive means to cause charge to accumulate on said discrete, charge-collection electrodes according to the spatial distribution of intensity of radiation to which said radiation conversion means is exposed, and read-out means for outputting a signal representative of charge that accumulates on the discrete, charge collection electrodes of the first capacitive means.

The radiation detector has a dual-capacitive structure which serves to protect the read-out circuitry from exposure to relatively high electrical voltages associated with the operation of the radiation conversion means. Also, the structure of the radiation detector enables a relatively high frame rate imaging capability to be attained.

According to another aspect of the invention there is provided a radiation detector comprising, first capacitive means including a semiconductor substrate and a two-dimensional array of discrete, charge-collection electrodes formed on a first surface of the semiconductor substrate, each said charge-collection electrode forming part of a respective first capacitor, second capacitive means comprising a second capacitor arranged in series with the first capacitors of the first capacitive means, the second capacitor comprising a layer of a radiation conversion material for converting radiation to which the layer is exposed into electrical charge and focussing means for focussing charge generated in the layer of radiation conversion material onto said discrete charge-collection electrodes, whereby charge accumulates on the charge-collection electrodes substantially according to the spatial distribution of the intensity of said radiation, and read-out means for outputting a signal representative of charge that accumulates on the discrete, charge-collection electrodes.

DESCRIPTION OF THE DRAWINGS

Radiation detectors according to the invention will now be described, by way of example only, with reference to the accompanying drawings in which:

FIGS. 4a to 4d illustrate how the radiation detector is sequenced;

DESCRIPTION OF PREFERRED EMBODIMENTS

Figure 1:
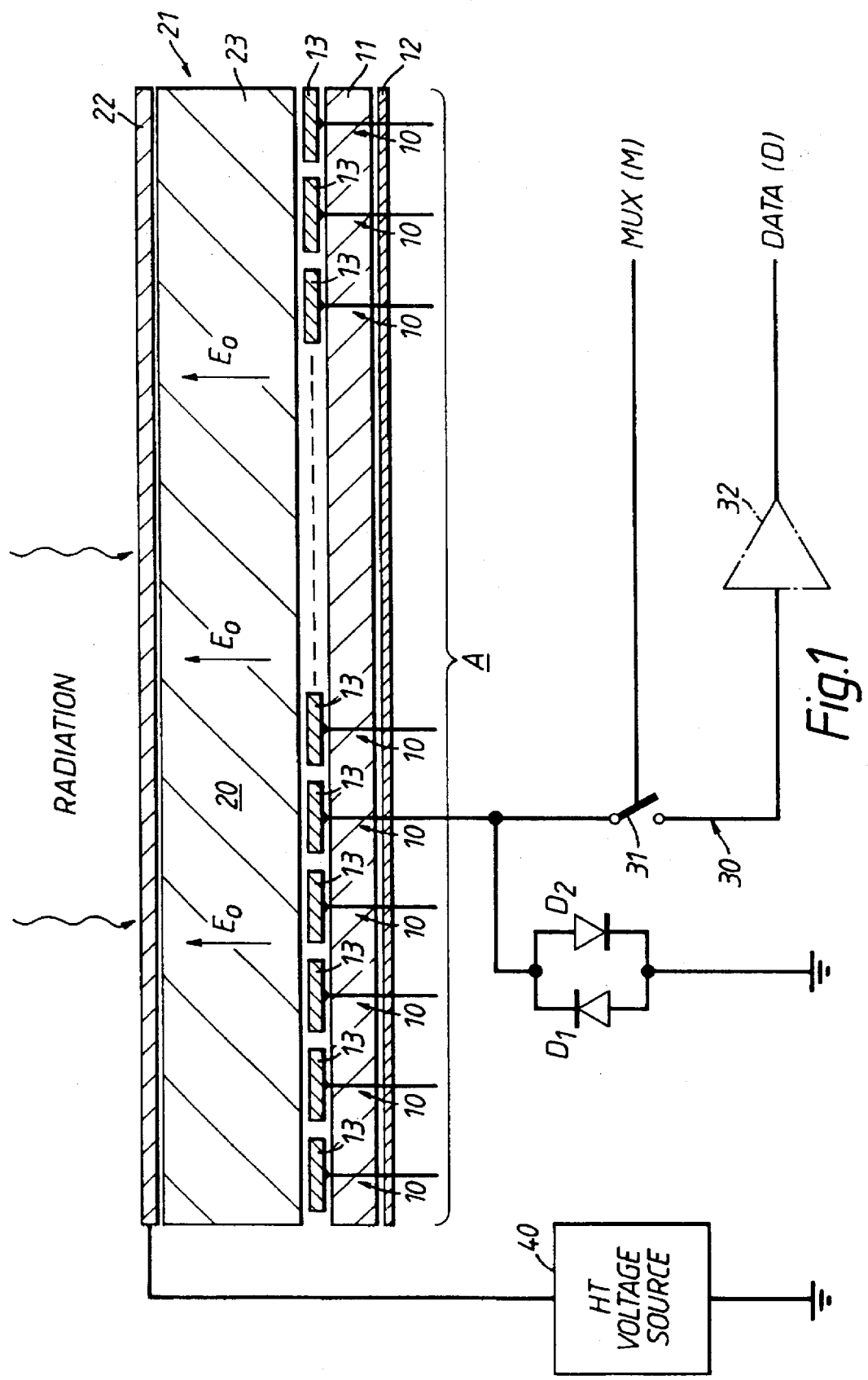
FIG. 1 illustrates diagrammatically a radiation detector according to one embodiment of the invention.

Referring now to FIG. 1, the radiation detector includes a dual-capacitive structure comprising an array A of first capacitors 10 and a second capacitor 20, and further includes semiconductor read-out circuitry 30.

The second capacitor 20 incorporates a radiation converter 21. The form of radiation converter used will depend upon the particular application to which the radiation detector is being put. In this particular embodiment, the radiation detector is suitable for the detection of X-radiation with high resolution, and the radiation converter 21 comprises a flat plate electrode 22 made from a suitable radiation-transmissive material and an ionisation medium 23, which could be a solid, liquid or a gas, contained within an ionisation chamber (not shown).

The array A of first capacitors 10 is formed by a thin layer 11 of a dielectric material disposed between a planar electrode 12 and a two-dimensional array of discrete, charge-collection electrodes 13 arranged in rows and columns (of which only a single row is shown in FIG. 1). Each discrete electrode 13 forms part of a respective said first capacitor 10 in the array A.

In a typical embodiment, layer 11 might comprise a sheet of glass fibre composite forming part of a printed circuit board with metal pads forming the electrode array 13 and a ground plane forming the planar electrode 12.

As will be described in greater detail hereinafter, electrode 22 of the radiation converter presents a surface which is exposed to radiation being detected, and each discrete electrode 13 corresponds to a single pixel in the image of the detected radiation which is to be formed by the radiation detector.

Figure 2A:
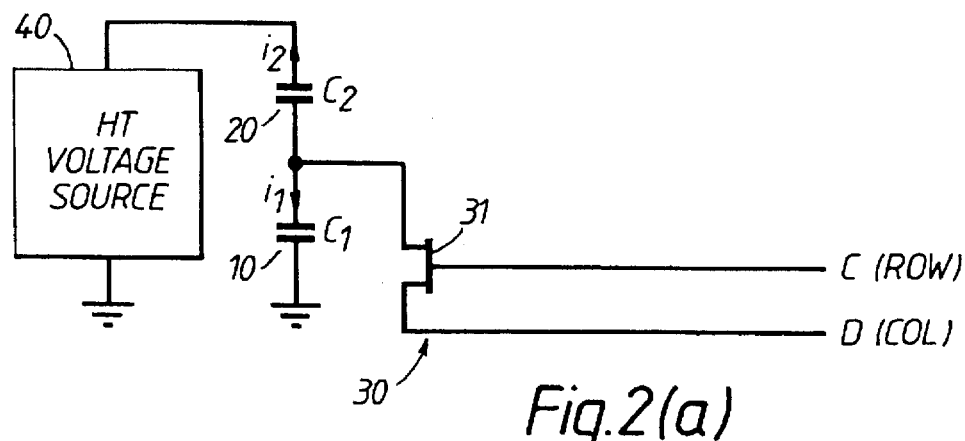
FIGS. 2(a) to 2(c) show the equivalent circuits of different implementations of the radiation converter shown in FIG. 1.
Figure 2B:
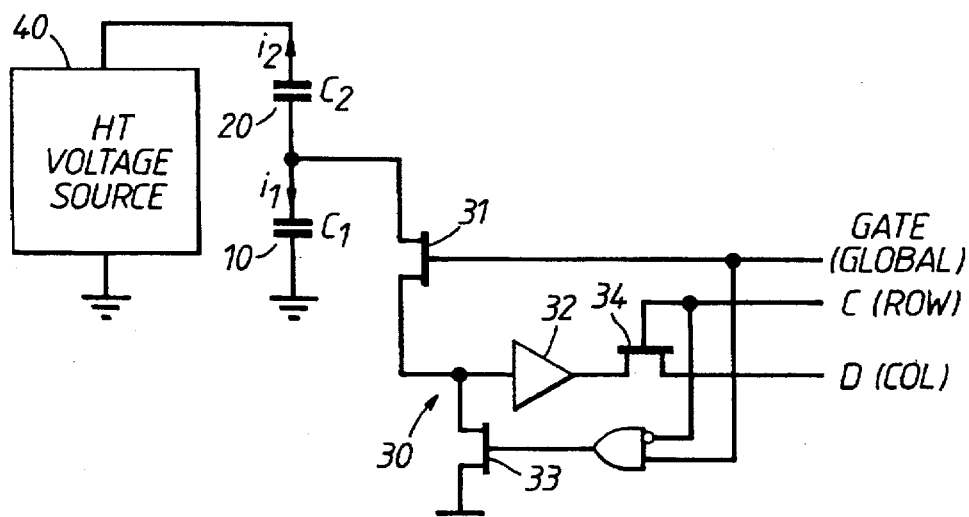
Figure 2C:
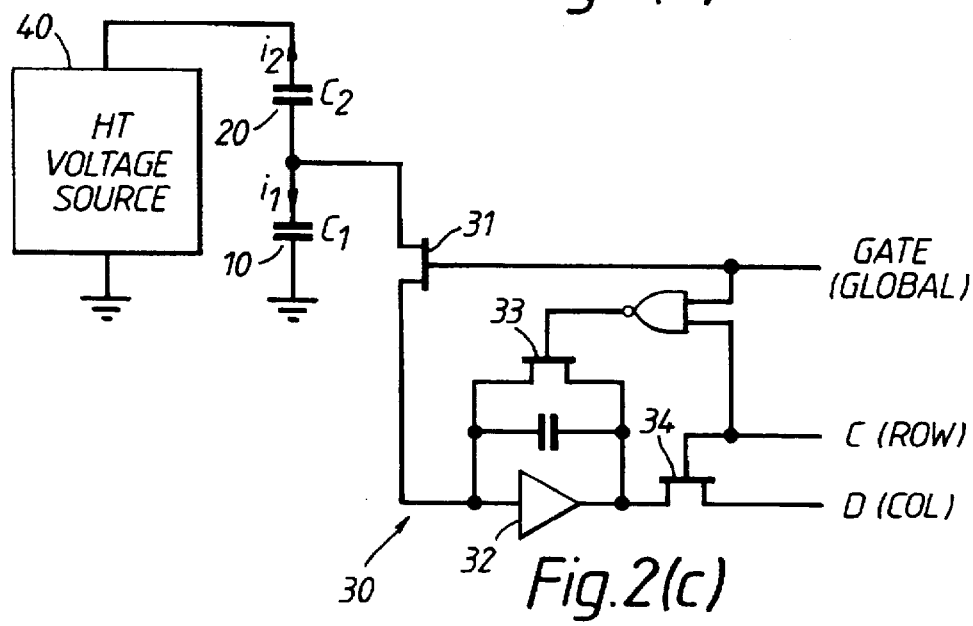

Referring now to the equivalent circuits shown in FIGS. 2a–2c, electrode 22 is connected to an HT voltage source 40. The arrangement is such that each capacitor 10 is connected in series to capacitor 20. For clarity, FIGS. 2a–2c show only one of the capacitors 10 in the array A.

The HT voltage source 40 supplies a voltage $V_{EHT}$ to electrode 22 and creates a strong electric field $E_o$ across the ionisation medium 23.

In operation of the radiation detector, incident radiation ionises the ionisation medium 23 creating electrons and positive ions, or in the case of a semiconductor, electrons and holes. These charges will drift in the direction of the applied electric field, $E_o$, to electrodes 13 and 22. When $+V_{EHT}$ is connected to electrode 22, electrons will drift to electrode 22 whereas the positive ions or holes are caused to drift to the discrete electrodes 13.

The charge which accumulates on the array of discrete electrodes 13 corresponds substantially to the spatial distribution of the intensity of incident radiation.

It is the function of the read-out circuitry 30 to output a signal representative of charge that has accumulated on electrodes 13, which signal can then be processed to generate a two-dimensional image representing the spatial distribution of intensity of the incident radiation. To that end, each electrode 13 is connected to a respective data line (D) via a respective semiconductor switch in the form of a field effect transistor (FET or JFET) 31 and an optional amplifier 32.

FIG. 2(a) shows the simplest implementation in which the amplifier 32 is omitted, whereas FIGS. 2(b) and 2(c) show more complex implementations in which the amplifier is included. Each amplifier 32 has an associated reset switch 33 and output multiplexer switch 34. FIG. 2(b) shows the arrangement for a voltage sensitive amplifier whereas FIG. 2(c) shows the arrangement for a current sensitive amplifier.

With the respective switch 31 open, each first capacitor 10 in array A integrates part of the total signal current $i_{sig}(t)$. Since $$i_{sig}(t)=i_1(t)+i_2(t), \quad (1)$$

where $i_1(t)$ is the current flowing through the respective capacitor 10 at time t, and $i_2(t)$ is the current flowing through capacitor 20, then respective voltages $V_1$, $V_2$ are developed across each capacitor 10 and across capacitor 20 according to the expression $$V_1=-V_2=\int_o^t i\frac{i_1(t)dt}{C_1}=-\int_o^t i\frac{i_2(t)dt}{C_2}, \quad (2)$$

where $t_i$ is the time interval during which charge accumulates on the discrete electrodes 13 i.e. the integration period, $C_1$ is the capacitance of the first capacitors 10 and $C_2$ is the capacitance of the second capacitor 20.

The respective voltage $V_1$ developed across each first capacitor 10 during the integration period is $t_i$ is proportional to the integrated intensity of radiation received at the corresponding pixel during that period. Accordingly, by reading out the voltages $V_1$, an image of the intensity distribution of incident radiation can be derived.

In order to maximise the detected output signal, the current $i_2$ flowing through the second capacitor 20 should be as small as is practicable. It follows from equation (2) above that, $$i_1/i_2=-C_1/C_2 \quad (3)$$

and so the value of $C_1$ should be much larger than the value of $C_2$. Typically, the ratio of $C_2:C_1$ should be in the range 5 to 10,000, and preferably in the range 100 to 10,000. This can be achieved by making layer 11 as thin as possible, and by forming the layer from a material which has a high dielectric constant.

Also, the time constant $\tau$ of the circuit formed by FET 31 in its off condition and by the first capacitors 10 should be large relative to the sum of the integration period $t_i$ and the read-out period $t_r$, whereby to reduce the possibility of signal loss caused by the first capacitors 10 discharging through FET 31.

The time constant $\tau$ is given by the expression $$\tau=R_oC_1 \quad (4)$$

where $R_o$ is the resistance of FET 31 when it is off.

Accordingly, the optimum conditions prevail when the values of $R_o$ and $C_1$ are both large. It is also advantageous to reduce the read-out period $t_r$ of the detector.

As will now be explained, the switching condition of each FET 31 is so controlled as to determine the order in which the voltages $V_1$ are read out from the first capacitors 10 in array A.

As shown in FIGS. 2a to 2c, the source of each FET 31 is connected to the associated discrete electrode 13, whereas the drain is connected to a respective data line D via the optional amplifier circuit 32.

Figure 3:
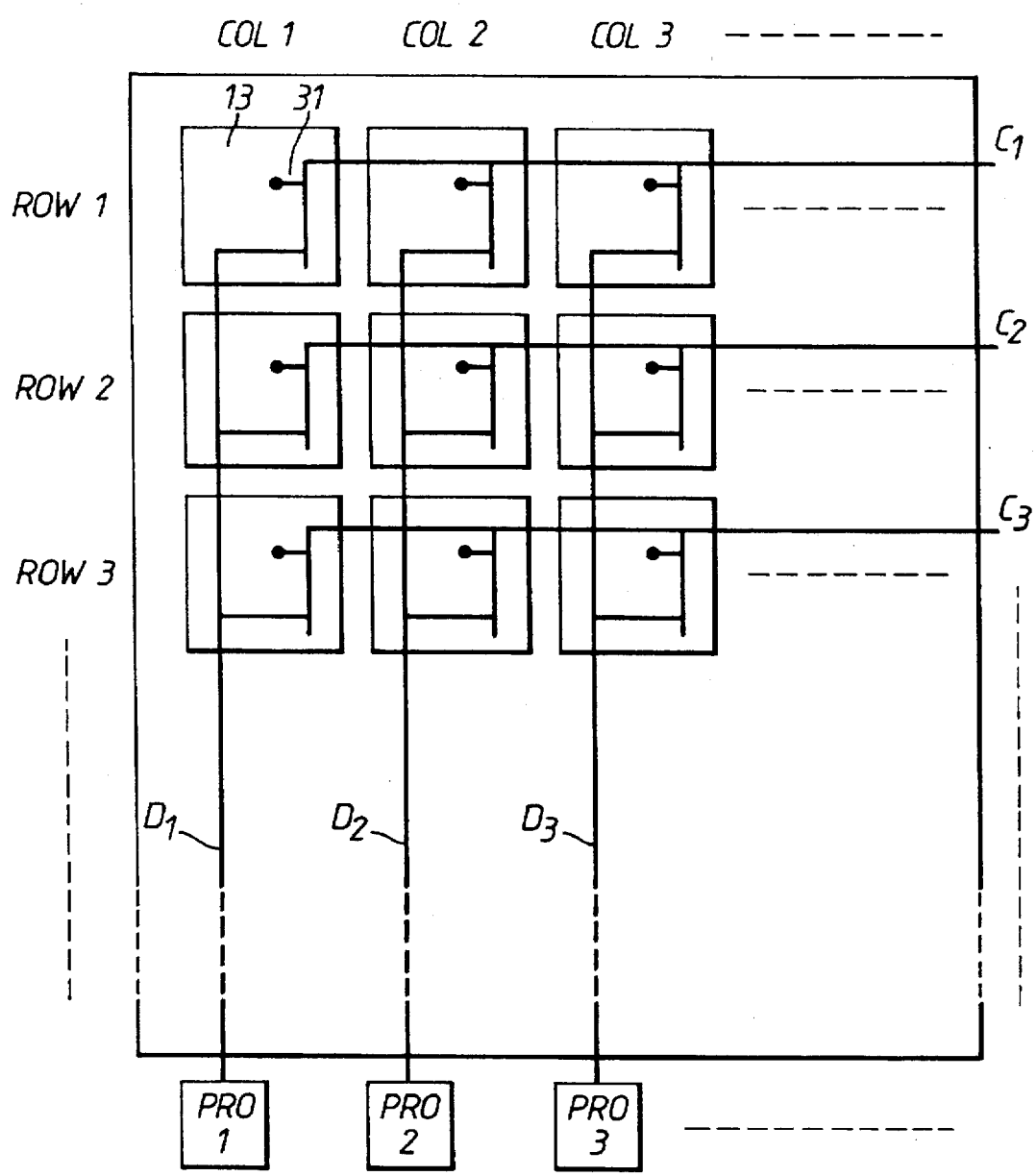
FIG. 3 shows diagramatically the read-out circuitry of the radiation detector illustrated in FIG. 1.

FIG. 3 illustrates diagrammatically how the read-out circuitry is arranged when, as described with reference to FIG. 2(a), the amplifier circuits 32 are omitted.

In this case, FETs 31 connected to electrodes 13 in the same row (ROW 1, say) have their gates connected to the same control line (C 1), and similarly, FETs connected to electrodes 13 in the same column (COL 1, say) have their drains connected to a common data line (D 1) which, in turn, is connected to a common processing circuit (PRO 1). With this arrangement, voltages $V_1$ developed across the capacitors 10 in a selected row (ROW 1, say) can be read out by setting the control line (C 1) for that row HIGH and setting the other control lines (C 2, C 3 . . .) LOW. In this condition, the FETs in the selected row will all be closed, whereas all the other FETs, associated with the other, non-selected rows will be open. Therefore, the signals on the respective data lines D for the selected row will represent the voltages $V_1$ developed across the respective capacitors 10 in that row and can be read out by external processing circuits PRO 1, PRO 2 . . . either sequentially, column-by-column, or simultaneously, in multiplex fashion.

This procedure is then repeated for the other rows in the array until the voltages $V_1$ across all the capacitors 10 have been read out.

The external processing circuits PRO 1, PRO 2 . . . may be either current sensitive or voltage sensitive.

When amplifier circuits 32 are included, the read-out circuitry will be arranged differently. In this case, a global gate control signal GATE is applied simultaneously to all the FETs 31 in the array, whereas the reset switch 33 and the output multiplexer switch 34 associated with each amplifier 32 in the same row are controlled via a common multiplexer control line C. Output signals on the respective data lines D for a selected row are then read out column-by-column or in multiplex fashion, as before.

FIGS. 4(a) to 4(d) illustrate diagrammatically, by way of example, how the radiation detector is sequenced in order to accumulate charge in response to incident radiation and to read out the charge stored on the capacitors 10. There are four stages in each sequence, as follows:

Stage 1 (FIG. 4a)

The radiation beam is turned on and the FETs 31 are all opened such that each discrete electrode 13 is in effect floating from ground potential.

The incident radiation ionises the ionisation medium 22 of the radiation converter 21 causing, for example, positive ions (+) to accumulate on the discrete electrodes 13.

Stage 2 (FIG. 4b)

Momentarily before reading the charge stored on the electrodes 13, the reset switch 33 is opened.

Stage 3 (FIG. 4c)

The transistor 31 is then closed, thus allowing charge stored on the electrode to reach the external processing circuits, PRO1, PRO2 . . . The signal at the output of the processing circuit is proportional to the radiation intensity during the integration period.

Stage 4 (FIG. 4d)

By closing switch 33 the electrode 13 is connected to ground potential, thus resetting the pixel ready for the next integration period (stage 1).

Every pixel on the array is capable of storing charge at all points in the readout cycle, except in stage 4. Therefore, the detector may be used to accumulate a single image in which the radiation beam is turned on and off again within stage 1 only, or it may be operated in a continuous (cine) mode by continuously cycling the detector through the four stages in sequence with the beam being turned on continuously.

The dielectric layer 11 and at least some of the read-out circuitry 30 associated with the array A of first capacitor 10 may advantageously be fabricated from a common substrate of semiconductor material, such as hydrogenated amorphous silicon (a-Si:H) or polysilicon (p-Si). The discrete charge-collection electrodes 13 which, in effect, define the size and pitch of the pixels in the detector may be formed on a surface of the semiconductor substrate by evaporation, or any other suitable deposition technique, and, in one implementation, associated circuit components (e.g. FET 31) may be buried in the substrate material immediately below the respective electrode 13. The control lines C and GATE and data lines D which interconnect the circuit components extend out to adjacent edges of the substrate for connection to the associated processing circuitry. This configuration in which the circuit components are located beneath each pixel-defining electrode 13, has the advantage that the spacing between electrodes can be reduced significantly, with the result that the detector will be sensitive to radiation incident over more than 90% of the exposed detector area even though the pixels themselves may be relatively small, typically less than 100 μm across.

It is known that the resistance R of an a-Si:H FET is given by the expression $$1/R = (W/L) \mu_{FE} (V_G - V_T) C_G \quad (5)$$

where W and L are the width and the length respectively of the FET, $\mu_{FE}$ is the carrier mobility, $V_T$ is the threshold voltage, $V_G$ is the gate voltage, where $V_G > V_T$, and $C_G$ is the gate capacitance.

When the FET is 'closed' (i.e. the low resistance, 'read-out' state), the above parameters might typically have values as follows:

$W/L = 10$ $\mu_{FE} = 0.5$ cm$^{-2}$ V$^{-1}$sec$^{-1}$ $V_T = 1V$ $V_G = 5V$ $C_G = 10^{-8}$ Fcm$^{-2}$.

Applying these values to equation 5 above, the FET resistance $R_{on}$ during read-out would be approximately 5MΩ.

In the case of a detector having a relatively small pixel size, 100 μm square, say and a dielectric layer 11 one micrometer thick, the capacitance $C_1$ of each capacitor 10 would be 500 fF. Accordingly, the read-out time constant $\tau_R$ ($= R_{on} \cdot C_1$) for a pixel in the array would be about 2.5 μsec so that in the case of an array consisting of 2000 rows, the read-out period for the entire array would be about 25 msec, corresponding to a peak frame rate of 40 frames sec$^{-1}$, this allowing a period of 5 $\tau_R$ to read-out data from all the pixels in a row. Higher frame rates than this could, of course, be achieved by increasing the ratio W/L of the FET, and/or by increasing the gate voltage $V_G$.

A problem associated with electrical circuitry fabricated in semiconductor materials, such as a-Si:H is its susceptibility to electrical breakdown due to exposure to high electrical voltages.

However, the radiation detector described with reference to FIG. 1 has a number of beneficial features that are designed to protect the read-out circuitry from damage which it might otherwise suffer both during the integration stage, while electrical charge is accumulating on the discrete electrodes 13, and also during the read-out stage.

The semiconductor material in layer 11 has a high dielectric constant and so, because of the ratio of capacitances, protects the read-out circuitry 30 from electrical discharge that could occur in the radiation converter 21. In addition, optional back-to-back diodes (D1,D2) may be connected across each FET 31 to provide additional protection, preventing a build-up of large electrical signals in the event of detector flashover. The high resistivity of layer 11 also ensures low leakage current and so low shot noise at each pixel.

Furthermore, the voltage ($V_{EHT} - V_1$) developed across the capacitor 20 will generally be much larger than the voltage $V_1$ developed across the capacitor 10 and this ensures that the voltage across the radiation converter 21 is maintained substantially constant, resulting in good signal linearity over a wide range of integrated input signal.

The radiation detector described with reference to FIG. 1 incorporates a radiation converter 21 in the form of an ionisation medium, and is suitable for the detection of X-radiation with high resolution. Good spatial resolution is obtained due to the high electric field $E_o$ within the ionisation medium caused by the applied voltage $V_{EHT}$. This field tends to confine charged particle motion to movement in a direction perpendicular to the plane of electrodes 13 and 22. Since positive ions typically have lower mobility than electrons in ionisation media, spatial resolution will usually be maximised when positive ions are caused to drift to electrode 13.

Figure 5:
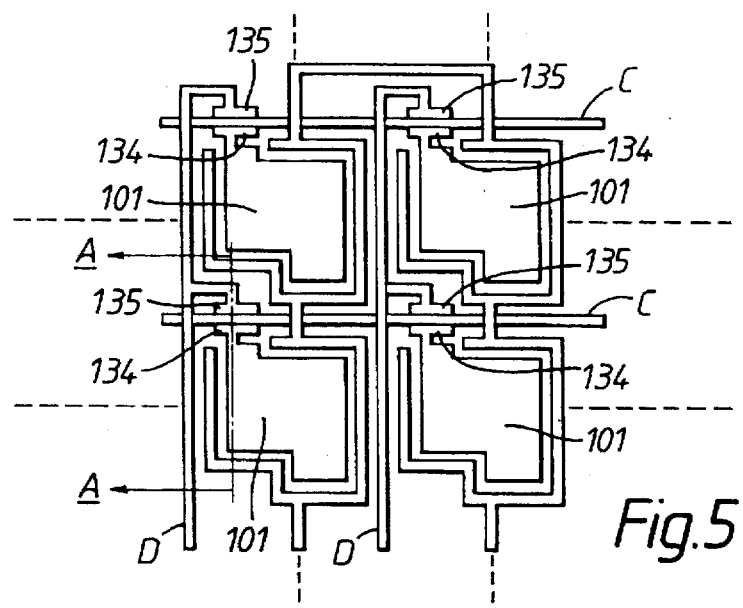
FIG. 5 is a simplified plan view of a group of four charge-collection electrodes in a radiation detector according to another embodiment of the invention.
Figure 6:
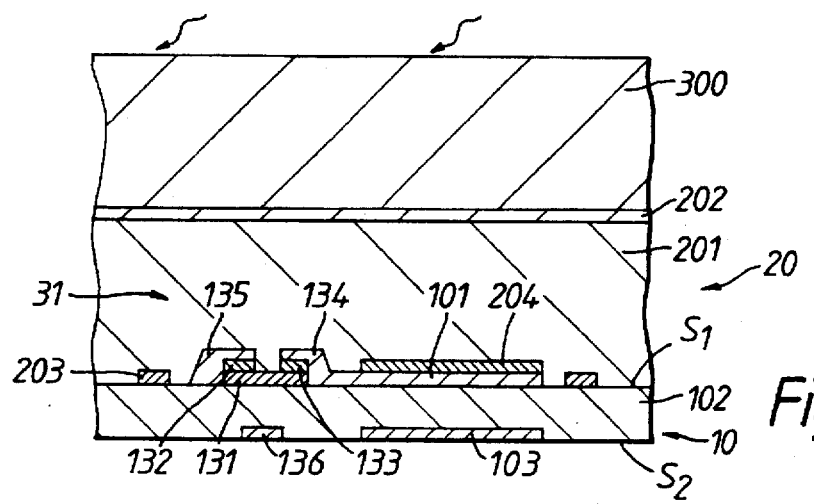
FIG. 6 shows a simplified cross-sectional view through part of the radiation detector shown in FIG. 5.
Figure 7:
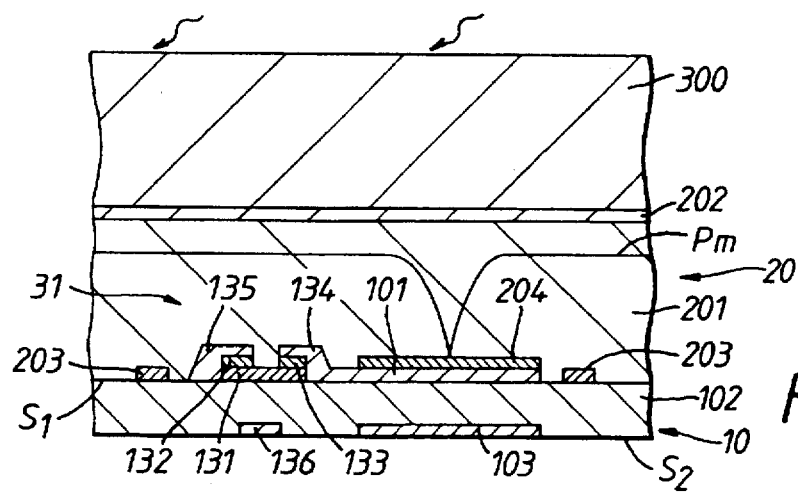
FIG. 7 shows an idealised distribution of the potential minimum for electronic focussing in the radiation detector shown in FIGS. 5 and 6.

FIGS. 5, 6 and 7 illustrate a preferred embodiment of the invention in which the dual capacitive structure is fabricated from hydrogenerated amorphous silicon (a-Si:H), although polysilicon (p-Si) could alternatively be used. As in the case of the embodiments described with reference to FIGS. 1 to 4, the dual capacitive structure comprises a two-dimensional array of first capacitors 10, each having a discrete charge-collection electrode 101 at which charge can accumulate, and a common, second capacitor 20 overlying, and connected in series with, the first capacitors 10.

FIG. 5 is a simplified plan view showing a group of four charge-collection electrodes 101 which form part of a larger two-dimensional array- Each electrode 101 forms part of a respective capacitor 10, and FIG. 6 shows a cross-sectional view through the radiation detector, taken on line A—A in FIG. 5, through only one of the capacitors 10.

Referring to FIG. 6, each capacitor 10 comprises a layer 102 of a-Si:H:N bearing a charge-collection electrode 101 on one surface $S_1$, thereof, and a corresponding pixel electrode 103 at the opposite surface $S_2$, directly below electrode 101. The pixel electrode is connected to ground potential.

Electrode 101 is connected to a data line D via a respective switching circuit comprising a field effect transistor 31 formed in layer 102 alongside the associated capacitor 10.

Each transistor 31 comprises a layer 131 of a-Si:H formed on surface $S_1$ of layer 102 and regions 132,133 of $n^+$-type material (a-Si:H:$n^+$) deposited on layer 131. Each such region 132,133 has a respective electrical contact; a contact 134 (the source electrode) connected to electrode 101 and a contact 135 (the drain electrode) connected to the respective data line D. The transistor 31 also has a gate electrode 136 formed at surface $S_2$ of layer 102, this being connected to the respective control line C.

The second capacitor 20 of the dual capacitive structure comprises a layer 201 of intrinsic a-Si:H which overlies the discrete electrodes 101 and their associated field effect transistors 31, and a layer 202 of $n^+$-doped material (a-Si:H:$n^+$) which is connected to a source of HT voltage and forms the top plate of the second capacitor 20.

A layer (not shown) of insulating material would also be provided to isolate the transistor and the data line from the layer 201.

In this embodiment, the radiation detector also comprises a layer 300 of a scintillator, caesium iodide (CsI) having a columnar structure. Layer 300 does not form part of the dual capacitive structure 10,20, but converts radiation that is to be detected (e.g. x-radiation or γ-radiation) to optical radiation, the intensity of optical radiation produced being dependent on the intensity of radiation to which layer 300 is exposed.

Optical radiation produced in this way, passes through layer 300 and into layer 201 of the second capacitor 20. Any spreading of the optical radiation in layer 300 is limited by the columnar, crystalline structure of the caesium iodide so that the spatial distribution of optical photons passing into layer 201 substantially matches the spatial distribution of the intensity of radiation to which layer 300 is exposed.

Individual photons entering layer 201 create electron-hole pairs in the semiconductor material of the layer. In this embodiment, holes will drift towards layer 202 formed of $n^+$-type material whereas electrons will drift towards a respective charge-collection electrode 101. In effect, the second capacitor 20 functions as a semiconductor drift chamber.

There is also provided on surface $S_1$ a thin, narrow layer 203 of heavily-doped $n^+$-type material (a-Si:H:$n^+$) which substantially surrounds each charge-collection 101 and its associated field effect transistor 31. Also, a layer 204 of heavily-doped $p^+$-type material (a-Si:H:$p^+$) is deposited on each electrode 101. The spatial distribution of layers 203, 204 is such as to create potential minima $P_m$ within the second capacitor 20, as shown in idealised form in FIG. 7, so that charge (in this embodiment electrons) produced within layer 201 is constrained to move within a potential well and is thereby focussed onto the respective charge-collection electrode.

It will, of course, be appreciated that the polarities of layers 202,203 and 204 could be reversed in which case holes will drift towards the charge collection electrodes 101 and electrons will drift towards layer 202.

The structure described with reference to FIGS. 5 to 7 has significant attributes.

Each switching circuit (FET 31) is positioned alongside, and in substantially the same plane as, the associated capacitor 10. Accordingly, layer 102 can be made relatively thin, typically about 300 nm, and so each capacitor 10 will have a much larger capacitance than that of capacitor 20, giving high dynamic range and linearity. With this configuration, the area of each charge-collection electrode 101 must be reduced in size in order to accommodate the associated FET. Nevertheless, by means of electronic focussing, as described, the detector can still attain a high charge-collection efficiency (the detector can be made sensitive to radiation incident on approximately 100% of the exposed detector area), and also provides excellent cross-talk rejection between neighbouring pixels.

The charge which accumulates on electrodes 101 in each row can be read out as before by controlling the data and control lines D,C. As described with reference to FIG. 3, the pixels in each row can be read sequentially, column by column or simultaneously in mulitplex fashion.

The structure described with reference to FIGS. 5 to 7 can be fabricated using well known amorphous silicon processing techniques.

Typically, an aluminium film is deposited on a flat substrate, made from glass for example, and is etched to form the gate electrodes 136, the associated control lines C and the pixel electrodes 103.

A layer of amorphous silicon nitride (a-Si:H:N), typically 300 nm thick, is then deposited on the etched film, followed by a thin layer of intrinsic a-Si:H and then a thin layer of $n^+$-type material (a-Si:H:$n^+$). The layers of a-Si:H and $n^+$-type material are then etched away photolithographically to form layers 131 and the source and drain regions 132,133 of the transistors 31. A second aluminum film is deposited over the etched semiconductor material and this is then etched away to form the charge-collection electrodes 101, the source and drain electrodes 134,135 and the data lines D. A plasma etch process is then used to remove extraneous $n^+$-type material in the channel of the transistor 31.

Further layers of $n^+$-type and $p^+$-type material are deposited and etched photolithographically to form layers 203,204 used for electronic focussing. The detector is then completed by depositing an approximately 2 μm thick layer of intrinsic a-Si:H (layer 201) followed by a thin layer of $n^+$-type material (layer 202) on which a contact electrode is deposited by electrodeposition, and finally a 300 μm thick layer of columnar caesium iodide is deposited by chemical deposition and/or silk screen printing (layer 300).

It will be appreciated that the structure described with reference to FIGS. 5 to 7 is highly adaptable in that the same semiconductor substrate incorporating an array of capacitors 10, and their associated field effect transistors, control and data lines can be used in conjunction with a wide range of different radiation converters.

In an alternative embodiment, layers 201, 202 and 300 in FIG. 6 could be replaced by a single layer of a radiation conversion material which converts radiation that is to be detected directly into electron-hole pairs. An example of an especially useful material for this purpose is cadmium telluride (CdTe) which can be used to detect X-radiation, γ-radiation, α- or β-particles.

Cadmium Telluride is deposited by electrodeposition and if an abundance of $^{113}$Cd isotope is provided the resulting layer will be rendered sensitive to neutrons.

In a yet further embodiment, layers 201, 202 and 300 could be replaced by a liquid or gas or solid ionisation chamber similar to that described with reference to FIG. 1.

As will be appreciated from the described embodiments, the radiation detector provides a large-area, high resolution image well suited to medical imaging (e.g. X-radiation imaging). However, it will be understood that the invention is not limited to this application, and by suitable choice of radiation converter detectors according to the invention find a wide range of different imaging applications.

In another application of the invention, the radiation detector is used for $_1H^3$ autoradiography.

In this case, the radiation converter 20 comprises a thin photocathode evaporated onto the top surface of a microchannel plate. After labelling and electrophoresis, a gel under investigation is impregnated in a scintillation liquid before being placed on the photocathode of the radiation converter. $\beta^-$ particles emitted by the $_1H^3$ label cause the scintillation liquid to emit photons in the form of visible light which, in turn, liberate electrons from the photocathode. The photoelectrons enter the microchannel plate and are accelerated towards the array of charge-collection electrodes (13,101) where the negative charge accumulates. The electrodes (13,101) could be supported on a semiconductor substrate as described with reference to FIGS. 5 to 7. The gain of the microchannel plate assists in enhancing the signal-to-noise ratio of the detector output signal.

As in the embodiment described with reference to FIGS. 1 to 7, the capacitance $C_2$ of the radiation converter is much less than that of capacitance $C_1$, and so the latter is effective to protect the read-out circuitry 30 from high electrical voltage associated with the operation of the converter.

In another application of the invention, the radiation detector is used to image neutrons. $_{64}Gd^{158}$ is a stable nuclide with a natural abundance of −25% and a cross-section to thermal neutrons of $2.6 \times 10^5$ barns. It undergoes a (n, γ) reaction to produce $_{64}Gd^{157}$ (also a stable nuclide), with an energy of −7.9 MeV.

The reaction also produces low energy $\leq 41$ keV Auger electrons. It is these Auger electrons which are used to form the neutron image using a radiation converter similar to that used for detecting the $_1H^3$ label described hereinbefore. However, in this instance, a thin scintillation layer would be applied directly to the photocathode instead of using a scintillation liquid. A layer of $_{64}Gd^{158}$ would overlie and protect the scintillation layer and photocathode.

A neutron detector of this kind could be used in combination with a low energy ($\leq 500$ keV) X-ray detector. Typically, the X-ray detector would have a radiation converter comprising an ionisation medium adapted for high resolution, similar to that described with reference to FIG. 1. It would be necessary to ensure that sensitivity to high energy ($\leq 1$ MeV) X-rays is low in order to reduce contamination from the Gd neutron converter. However, since the two converters are so closely linked it would be possible to generate "neutron contamination correction factors" to compensate for this effect.

In a yet further application of the invention, the radiation detector may be used for $_{16}S^{35}$ auto-radiography. $_{16}S^{35}$ emits $\beta^-$ particles with an energy of 168 keV capable of penetrating a thin sheet of metal, such as beryllium.

In this case, the radiation converter 21 may comprise a liquid ionisation chamber, filled with suitable ionisation liquid such as iso-octane and having a window made from a thin sheet of beryllium. By sealing the chamber it would be possible to apply some pressure to the beryllium window for cleaning without deforming the chamber too greatly.

Preferably, however, a thin film of TEFLON polytetrafluoroethylene film (E.L du Pont de Nemours, Wilmington, Del.) or other tough plastics sheet would be stretched over the window to reduce operator damage, with little effect on detector sensitivity.

In order to increase the gain of the radiation converter, a wire multi-step avalanche stage or other high gain facility could be installed in the ionisation space of the ionisation chamber.

With a view to facilitating cleaning of the radiation converter, a solid ionisation medium such as a thick layer of a-Si:H or other amorphous semiconductor material could be used. Alternatively, an optically sensitive radiation converter as described hereinbefore for $_1H^3$ auto-radiography could be used.

As the above-described embodiments show, a radiation detector in accordance with the invention can be used to detect a range of different kinds of radiation including electromagnetic radiation (e.g. X-radiation, γ-radiation, optical radiation), charged particles (e.g. α-particles, β-particles), neutrons and also pressure waves and magnetic field.

In a further application of the invention, for imaging low energy α, β, X- and γ-radiation, the converter 23 could comprise a semiconducting polymer film using materials such as polypyrrole or polyaniline. In this case, the radiation could interact with the polymer which would allow signal transport to the charge collection electrodes. High atomic number elements could be added to the polymer substrate to improve the interaction probability of high energy X- and γ-rays. A further alternative would be to substitute polymer materials whose conductivity varies as a function of chemical concentration, thus forming a pixellated "electronic nose".

Accordingly, the radiation converter may take a variety of different forms depending upon the application to which the radiation detector is being put, including converters incorporating:

(a) group IV semiconductors (e.g. silicon and germanium in crystalline, polycrystalline or amorphous form). These materials are useful for detecting α, β, γ, X-ray or optical radiation.

(b) compound semiconductors including GaAs, CdTe, $HgI_2$, TlBr in crystalline, polycrystalline or amorphous form. These materials are useful for detecting α, β, γ, X-ray or optical radiation.

(c) semiconducting polymers.

(d) amorphous selenium. This material is useful for detecting α, β, γ and X-ray.

(e) gas ion chambers (e.g. Ar, Xe, Kr gases either pure or mixed with suitable quench agents at room or high pressure). Such converters could be used to detect α, β, γ or X-radiation.

(f) gas proportional chambers (e.g. Ar, Xe, Kr gases with suitable quench agents). Such converters could be used to detect α, β, γ or X-ray.

(g) liquid ion chambers (e.g. pure alcohols). Such converters could be used to detect α, β, γ or X-ray.

(h) scintillators combined with photocathodes having an electron accelerating gap forming the dielectric of capacitor 20. A converter of this kind could be used to detect α, β, γ or X-radiation.

(i) scintillators irradiating semiconductor layers, where the semiconductor layer forms the capacitance $C_2$. Converters such as this could be used to detect α, β, γ or X-radiation.

(j) Metal foils with high neutron interaction cross-section in contact with a device of type (a), (b), (c), (d), (e), (f), (g), (h) or (i). Such converters could be used to detect neutrons.

(k) Piezo-electric material. This material is sensitive to pressure waves. The interacting wave causes a voltage change across the piezo-electric material which forms the conversion medium 20. This change in voltage causes a current to flow in $C_1$ thereby generating the imaging signal.

Figures 8, 9:
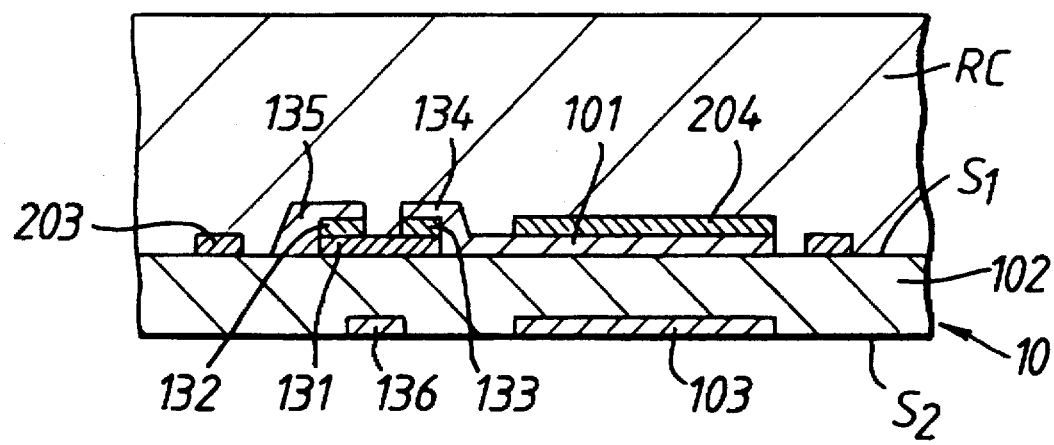
FIG. 8 is a simplified cross-sectional view through part of a radiation detector showing the radiation converter.
FIG. 9 is a diagrammatic illustration of an imaging system incorporating a radiation detector according to the invention.

(l) Semiconductor material operated as a Hall effect device. Such devices are sensitive to magnetic field. The generation of a Hall effect voltage across the semiconductor used as the conversion medium 20 causes a current to flow in $C_1$ thereby generating the imaging signal. These alternative forms of radiation converter are represented diagrammatically by the component referenced RC in FIG. 8.

In almost every case, the radiation converter generates charged particles in response to incident radiation causing charge to accumulate on the charge-collection electrodes of capacitors 10, the resulting voltages $V_1$ developed across capacitors 10 being read-out using read-out circuitry.

A particular advantage of the described radiation detectors is that while the radiation converter may have a variety of different forms, as described herein, the structure defining the capacitors 10 and the readout circuitry 30 with which the converter is used requires no significant modification. Accordingly, experimentation using different kinds of radiation converter is relatively straightforward.

The radiation detectors which have been described have the same general structure, namely an array of discrete electrodes each defining a respective pixel in the image that is to be formed and comprising part of a respective first capacitor, a second capacitor incorporating a radiation converter and read-out circuitry for reading out a signal representative of charge that accumulates on the discrete electrodes of the first capacitors in response to radiation detected by the radiation converter.

As already explained, a dual capacitive structure such as this is advantageous in that the capacitance of the first capacitor protects the readout circuitry from exposure to relatively high electrical voltages used in the operation of the radiation converter. Also, when applied to medical imaging, the radiation detector provides the combination of high spatial resolution (due to the quasi one-dimensional path of charge carriers generated in the radiation converter), and high quantum efficiency (due to the relatively large detector thickness possible compared to the scintillation phosphors used with X-ray film and other pixellated detectors).

Also, with an appropriate choice of radiation converter, the described radiation detectors provide a high frame rate imaging capability with little or no image lag. This cannot currently be achieved using known amorphous silicon (a-Si:H) detectors due to the number of trapping states in the a-Si:H itself. A radiation detector according to the invention may be incorporated in an imaging system, such as a medical X-radiation imaging system, as shown diagrammatically in FIG. 9.

INDUSTRIAL APPLICABILITY

The invention is applicable to large-area, two-dimensional, pixellated radiation detectors particularly, though not exclusively, for medical imaging e.g. medical X-radiation imaging.

I claim:

1. A radiation detector comprising,
a plurality of first capacitors forming a two dimensional array, each said first capacitor having a discrete, charge-collection electrode,
a second capacitor having a radiation-receiving surface, the second capacitor including radiation conversion means for converting radiation received at said radiation-receiving surface to electrical charge, each said first capacitor being connected electrically in series with said second capacitor and having a capacitance greater than the capacitance of said second capacitor,
charge-focussing means for focussing said electrical charge produced by said radiation conversion means onto the discrete, charge-collection electrodes of said plurality of first capacitors, whereby, in operation, electrical charge accumulates on said charge-collection electrodes substantially according to the spatial distribution of the intensity of radiation received at said radiation-receiving surface,
and read-out means for outputting an output signal representative of the accumulated charge on the discrete, charge-collection electrodes of said plurality of first capacitors.

2. A radiation detector as claimed in claim 1 wherein the ratio of the capacitance of each said first capacitor to the capacitance of said second capacitor is in the range from 10,000 to 5.

3. A radiation detector as claimed in claim 2 wherein the ratio of the capacitance of each said first capacitor to the capacitance of said second capacitor is in the range from 10,000 to 100.

4. A radiation detector as claimed in claim 1, wherein said plurality of first capacitors includes a layer of dielectric material, and said discrete, charge-collection electrodes are formed on a surface of said layer of dielectric material.

5. A radiation detector as claimed in claim 1, wherein said plurality of first capacitors comprises a layer of semiconductor material and said discrete, charge-collection electrodes are formed on a first surface of said layer of semiconductor material.

6. A radiation detector as claimed in claim 5 wherein said semiconductor material is hydrogenated amorphous silicon (a-Si:H) or polysilicon (p-Si).

7. A radiation detector as claimed in claim 5 wherein said read-out means comprises a plurality of field effect transistors each for connecting a respective said charge-collection electrode of said plurality of first capacitors to a data line, each said field effect transistor comprising a drain and a source formed on said first surface of said layer of semiconductor material adjacent to the respective said charge-collection electrode to which the field effect transistor is electrically connected.

8. A radiation detector as claimed in claim 7 wherein each said field effect transistor has a gate electrode formed on a second surface of said layer of semiconductor material.

9. A radiation detector as claimed in claim 8 wherein the gate electrodes of said field effect transistors are connected to control lines for enabling said read out means to output said output signal row-by-row or column-by-column.

10. A radiation detector as claimed in claim 9 wherein said read-out means comprises means for outputting said output signal from different rows (or columns) in said array either sequentially, column-by-column (or row-by-row) or in multiplex fashion.

11. A radiation detector as claimed in claim 7 wherein said charge-focussing means includes a body of semiconductor material formed on said first surface of said layer, said body of semiconductor material substantially surrounding each said charge-collection electrode and also surrounding the field effect transistor to which the respective charge-collection electrode is electrically connected.

12. A radiation detector as claimed in claim 11 wherein each said field effect transistor has a gate electrode formed on a second surface of said layer of semiconductor material.

13. A radiation detector as claimed in claim 12 wherein the gate electrodes of the field effect transistors are connected to control lines for enabling said read-out means to output said output signal row-by-row or column-by-column.

14. A radiation detector as claimed in claim 1 wherein said read-out means comprises a plurality of semiconductor switching devices each for connecting a respective said charge-collection electrode of said plurality of first capacitors to a data line.

15. A radiation detector as claimed in claim 14 wherein said semiconductor switching devices are field effect transistors, each said field effect transistor being situated immediately below the respective said charge-collection electrode.

16. A radiation detector as claimed in claim 14 wherein said semiconductor switching devices are field effect transistors, each said field effect transistor being situated adjacent to the respective said charge-collection electrode.

17. A radiation detector as claimed in claim 14 including means for electrically isolating said first capacitors and said second capacitor from said data line during a preset integration period during which electrical charge can accumulate on said charge-collection electrodes.

18. A radiation detector as claimed in claim 1 including a layer of a first radiation conversion material for converting radiation to which that layer is exposed to optical radiation, and wherein said radiation conversion means of said second capacitor includes a further layer of a second radiation conversion material for converting optical radiation produced in said layer of said first radiation conversion material to electrical charge.

19. A radiation detector as claimed in claim 18 wherein said first radiation conversion material is a crystalline material having a columnar structure.

20. A radiation detector as claimed in claim 19 wherein said first radiation conversion material is caesium iodide (CsI).

21. A radiation detector as claimed in claim 1 wherein said charge-focussing means creates a plurality of potential wells in said radiation conversion means, each said potential well being arranged to focus charge onto a respective said charge-collection electrode.

22. A radiation detector as claimed in claim 1 comprising a plurality of diode pairs, the diodes in each pair being connected together back-to-back to a respective said charge-collection electrode.

23. A radiation detector as claimed in claim 1 wherein said charge-focussing means includes a body of semiconductor material so arranged as to focus said electrical charge onto said charge-collection electrodes.

24. A radiation detector as claimed in claim 23 wherein said electrical charge focussed by said body of semiconductor material consists of electrons and said body of semiconductor material includes a body of p-type semiconductor material providing a charge-collection contact on each said charge-collection electrode.

25. A radiation detector as claimed in claim 1 including means for generating an electric-field across said second capacitor.

26. A radiation detector as claimed in claim 1 wherein the radiation conversion means is selected from the group consisting of:

(a) group IV semiconductors including silicon and germanium in crystalline, polycrystalline or amorphous form, (b) compound semiconductors including GaAs, CdTe, $HgI_2$, TlBr in crystalline, polycrystalline or amorphous form, (c) semiconducting polymers, (d) amorphous selenium, (e) ionisation media including gas ion chambers containing gases such as Ar, Xe, Kr, gases with quench agents, and liquid ion Chambers, (f) gas proportional chambers containing gases such as Ar, Xe, Kr, gases with suitable quench agents, (g) liquid ion chambers, (h) scintillators in combination with a photocathodes, (i) scintillators irradiating semiconductor layers, (j) metal foils having a substantial neutron interaction cross-section in combination with a device selected from (a) to (i) above, (k) piezo-electric material, and (l) semiconductor material operating as hall effect devices.

27. An imaging apparatus incorporating a radiation detector as claimed in claim 1.

28. A medical X-radiation imaging apparatus incorporating a radiation detector as claimed in claim 1.

* * * * *